(12) United States Patent
Rehwald et al.

(10) Patent No.: US 9,081,073 B2
(45) Date of Patent: Jul. 14, 2015

(54) SYSTEM FOR SUPPRESSION OF ARTIFACTS IN MR IMAGING

(75) Inventors: Wolfgang G. Rehwald, Chapel Hill, NC (US); Enn-Ling Chen, Chapel Hill, NC (US); Raymond J. Kim, Chapel Hill, NC (US); Elizabeth R. Jenista, Durham, NC (US)

(73) Assignees: Siemens Medical Solutions USA, Inc., Malvern, PA (US); Duke University, Durham, NC (US)

( * ) Notice: Subject to any disclaimer, the term of this patent is extended or adjusted under 35 U.S.C. 154(b) by 747 days.

(21) Appl. No.: 13/354,424

(22) Filed: Jan. 20, 2012

(65) Prior Publication Data
US 2012/0194187 A1    Aug. 2, 2012

Related U.S. Application Data

(60) Provisional application No. 61/436,701, filed on Jan. 27, 2011.

(51) Int. Cl.
| | |
|---|---|
| *G01V 3/00* | (2006.01) |
| *G01R 33/56* | (2006.01) |
| *G01R 33/563* | (2006.01) |
| *G01R 33/561* | (2006.01) |
| *G01R 33/567* | (2006.01) |

(52) U.S. Cl.
CPC .......... *G01R 33/5602* (2013.01); *G01R 33/563* (2013.01); *G01R 33/5616* (2013.01); *G01R 33/5617* (2013.01); *G01R 33/5673* (2013.01)

(58) Field of Classification Search
CPC .................................................. G01R 33/563
USPC ................ 324/307, 309, 306, 312, 314, 300; 600/413, 419
See application file for complete search history.

(56) References Cited

U.S. PATENT DOCUMENTS

| | | | | |
|---|---|---|---|---|
| 5,320,099 | A * | 6/1994 | Roberts et al. | 600/413 |
| 5,339,035 | A * | 8/1994 | Schneider et al. | 324/309 |
| 5,777,473 | A * | 7/1998 | Takai et al. | 324/309 |
| 6,694,166 | B2 * | 2/2004 | Salome et al. | 600/410 |
| 7,365,543 | B2 * | 4/2008 | Yui et al. | 324/318 |
| 8,093,895 | B2 * | 1/2012 | Umeda | 324/307 |
| 8,143,889 | B2 * | 3/2012 | Jeong et al. | 324/309 |
| 2010/0219829 | A1 | 9/2010 | Rehwald et al. | |

OTHER PUBLICATIONS

Nayla Chaptini, Wolfgang Rehwald, Elizabeth R Jenista, Michele A Parker, Enn-Ling Chen, Raymond J Kim, "A Robust and Simple Method to Suppress Ghosting Artifacts Arising from Long-T1 Species in Segmented ECG-gated Inversion Recovery (IR) Sequences", 2011 SCMR/EuroCMR Joint Scientific Sessions, Feb. 3-6, 2011, Nice France (2 pages).
Peter Kellman and Elliot R McVeigh, "Ghost Artifact Cancellation Using Phased Array Processing", Magnetic Resonance in Medicine 46:335-343 (2001).
Jenista ER, Rehwald WG, Chaptini N, Parker MA, and Kim RJ: Design of a robust method for suppression of ghosting artifacts due to long T1 species in cardiac imaging. Proc. Intl. Soc. Mag. Reson. Med. 19 (2011), abstract 614.

* cited by examiner

*Primary Examiner* — Louis Arana
(74) *Attorney, Agent, or Firm* — Peter R. Withstandley

(57) ABSTRACT

An MR system acquires, over multiple heart cycles, image datasets representing multiple image slices of an anatomical region of interest of a patient. In the device, an RF signal generator and a magnetic field gradient generator provides an RF pulse and magnetic field gradient sequence for RF signal excitation of the region of interest and for acquiring RF data following the signal excitation. The sequence comprises, a first sequence occurring substantially immediately after the acquisition of image data using a readout magnetic field gradient. The first sequence includes an RF pulse with a predetermined flip angle followed by a magnetic field gradient pulse for reducing field magnetization to substantially zero. The first sequence is preceded by a dummy acquisition sequence comprising the elements of the first sequence except substantially without acquisition of data.

31 Claims, 10 Drawing Sheets

SYSTEM FOR SUPPRESSION OF ARTIFACTS IN MR IMAGING

This is a non-provisional application of provisional application Ser. No. 61/436,701 filed 27 Jan., 2011, by W. Rehwald, et al.

FIELD OF THE INVENTION

This invention concerns a system for suppressing artifacts arising from long longitudinal relaxation time (T1) of tissue, fluids, or other matter in MR imaging.

BACKGROUND OF THE INVENTION

Magnetic resonance imaging (MRI) acquires data in the spatial frequency domain (k-space), which includes multiple lines which may be termed phase encodes. The k-space data set is converted to an image using the fast Fourier transform (FFT). In many applications, the acquisition of k-space is distributed over several applications of the pulse sequence (called 'segments'). Alternatively, the acquisition of k-space can be acquired all at once, called 'single-shot' imaging. Any periodic distortions in k-space may result in artifacts in the final image, where an artifact is a feature that appears in the final image, but is not actually present in the target object.

In MRI, image artifacts often hamper clinical image evaluation. One type of artifact (ghosting) stems from fluids, tissue or other matter with a long longitudinal recovery time, T1, referred to as "long T1 species". Such long T1 species include pericardial and pleural effusion, cerebrospinal fluid (CSF) (in the brain and spinal canal), and saline in breast implants. Effusions can occur in different parts of the human body, for example surrounding the heart and within the pericardium (pericardial effusions) or in the lungs (pleural effusions).

The ghosting artifact from long T1 species occurs in MR images obtained using an inversion recovery pulse sequence with a segmented acquisition (Patent application US20100219829 "Long T1 Artifact Suppression Techniques for Magnetic Resonance" (Sep. 2, 2010) by Wolfgang G Rehwald, Enn-Ling Chen, Raymond J. Kim). This sequence repeatedly plays out the same scheme of inversion recovery (IR) pulses and readout (RO) events, but acquires a different set of phase encoding lines during each RO. FIG. 1 shows a timing diagram of such a known segmented IR sequence (gated using the ECG in this example) and shows the arrangement of acquired MR data in a raw data space. For long T1 species, if there is not adequate time between subsequent inversion pulses, a periodic distortion of the raw data occurs, which, when Fourier transformed, causes the long T1 species to appear shifted by an offset amount and superimposed on the final image.

These ghosting artifacts can be superimposed on an image as a "ghost" at multiple erroneous locations thereby obscuring patient morphology and true location of a long T1 species. FIG. 2 shows an example of such ghosting artifacts in a patient. In the example, saline in breast implants (arrows 201) has a very long T1 and causes multiple ghosts across the field of view indicated by the arrows 207.

A second type of artifact occurs in single shot imaging which use inversion pulses. If a stack of single shot images are acquired without adequate recovery time between image acquisitions, the image intensity of long T1 species oscillates between images. Since image intensity is usually interpreted as coming from differences in T1 (where brighter contrast is shorter T1 and darker contrast is a longer T1) this can complicate image interpretation.

The source of the artifacts comes from the oscillations in the magnetization of the long T1 species. FIG. 3 shows the magnetization of a short 303, medium 307, and long T1 species 309. The imaging period in this example equals twice the RR interval 311 where each RR interval is the duration of one heart beat. Each "imaging RR" 311 is followed by a "waiting RR" 313 to let the magnetization recover. The short 303 and medium 307 T1 magnetization passes through respective same recovery curves during each RR imaging period and are in "steady state", but the magnetization of the long 309 T1 signal does not. The long 309 T1 magnetization signal has a different amplitude during each of the RR interval readouts as shown by curve 309 and the long T1 species is not at steady state. The oscillations lead to phase errors in the raw data that result in described ghosting along the phase encoding direction in the image.

The long T1 ghosting artifacts can prevent a clinical diagnosis from being made based on the acquired MR images. For example, a ghost from pleural effusion may be superimposed on a structure of interest such as a long axis view of the heart so that a diagnosis is not possible. Even more problematic, the ghosting may lead to an incorrect diagnosis in for example delayed enhancement (myocardial viability) images. Smaller bright ghosts from the spinal fluid superimposed onto the myocardium may be misinterpreted as infarcts. This may lead to a false positive diagnosis and possibly inappropriate patient treatment.

Known MR systems which use an IR pulse to create image contrast, address the artifact problem by including dummy heartbeats (DHBs) that are played at the beginning of a scan. A DHB sequence is a pulse sequence (in this case, an inversion pulse and RF and gradient pulses that are usually played to acquire data) played in the leading period, but no data is recorded (the recoding event is turned off, giving a dummy readout, DR). Whereas this improves image quality, it does not completely remove the long T1 ghosting. The known "dummy heartbeats" methods weaken the intensity of the ghosting artifact but do not fully remove it since a single dummy period is not enough to drive the long T1 fluid into steady state. In order to fully remove a long-T1 ghosting artifact using only dummy heartbeats one would need at least four dummy heartbeats leading to 4×2=8 additional heartbeats. This exceeds a patient's breath hold capability. Therefore, the known "dummy heartbeats" methods fail to fully prevent the long T1 ghosting artifact.

Another known system places a saturation slab over the region containing the long T1 fluid. This depends on the skill of the scanner operator and can only be done in special cases where the long T1 fluid is not part of the imaged structure. This is not a solution for pericardial effusion as it is a substantial part of the imaged structure (the heart). Even when this method is possible, such as in pleural effusion, it requires scanner operator skill and time to position the saturation slab and adjust its thickness. Additionally, the time delay between the saturation pulse and the center of k-space allows for some magnetization to recover, and artifacts may still occur. In the case where there is more than one region with long T1 fluids, multiple saturation slabs need to be manually placed further complicating scanner operation.

Another known system uses a pre-suppression module that, together with dummy heart beats, works better than dummy heartbeats alone. This method requires a precisely set time delay after the inversion pulse, which is difficult if not impossible to calculate, as parameters needed for the calculation are not exactly known or can vary during the scan.

Additionally, the time delay is only optimized for one long T1 species, and if other long T1 species are present this method will not suppress them.

A further known method is a phase sensitive inversion recovery (PSIR). This method uses image processing to remove ghosting artifacts, and does not prevent them from being generated in the first place. Additionally, this method only works when the long T1 species is located in close proximity to one of the RF coils used to acquire the image. A system according to invention principles addresses these and related problems.

SUMMARY OF THE INVENTION

This system advantageously uses the application of RF pulses and gradients after the readout (acquisition) of each data segment to suppress ghosting artifacts from fluids with long T1 values (T1≥1 second) such as pericardial effusion, pleural effusion, saline in breast implants, and cerebrospinal fluid. This system forces long T1 magnetization into steady state, preventing oscillations in k-space which result in ghosting artifacts in the final image. An MR image acquisition device acquires, over multiple heart cycles, image datasets representing one or more image slices of an anatomical region of interest of a patient. In the device, RF (Radio frequency) coils provide RF signal excitation of the region of interest and acquire RF data following the signal excitation in response to a pulse sequence. The pulse sequence is used by the MR image acquisition device in acquiring RF data. The pulse sequence comprises, an inversion (or saturation pulse) followed by a time delay and an image readout (acquisition) and a saturation pulse preceded and followed by magnetic field gradient pulses for dephasing.

In one embodiment an MR image acquisition device acquires, over multiple heart cycles, image datasets representing multiple image slices of an anatomical region of interest of a patient. In the device, an RF (Radio Frequency) signal generator and a magnetic field gradient generator provides an RF pulse and magnetic field gradient sequence for RF signal excitation of the region of interest and for acquiring RF data following the signal excitation. The sequence comprises, a first sequence occurring substantially immediately after the acquisition of image data using a readout magnetic field gradient. The first sequence includes an RF pulse with a predetermined flip angle followed by a magnetic field gradient pulse for reducing field magnetization to substantially zero. The first sequence is preceded by a dummy acquisition sequence comprising the elements of the first sequence except substantially without acquisition of data.

This system is compatible with a variety of different types of magnetization preparation (inversion pulse, T2-preparation, magnetization preparation). It increases signal to noise ratio (SNR) and image contrast since a saturation pulse is played away from the preparation module (such as an IR pulse) allowing for a maximal amount of signal recovery before next preparation. It reduces scan time relative to the dummy heart-beat (DHB) method, since it only requires one DHB to get the system to steady state. The system is user friendly and relatively easy to use since it eliminates parameters for a scan operator to change, and is similarly easy to implement into a pulse sequence. The system further eliminates artifacts from segmented imaging with IR pulses, and also regularizes image contrast for signal shot imaging.

DETAILED DESCRIPTION OF THE INVENTION

Definitions

Figure 1:
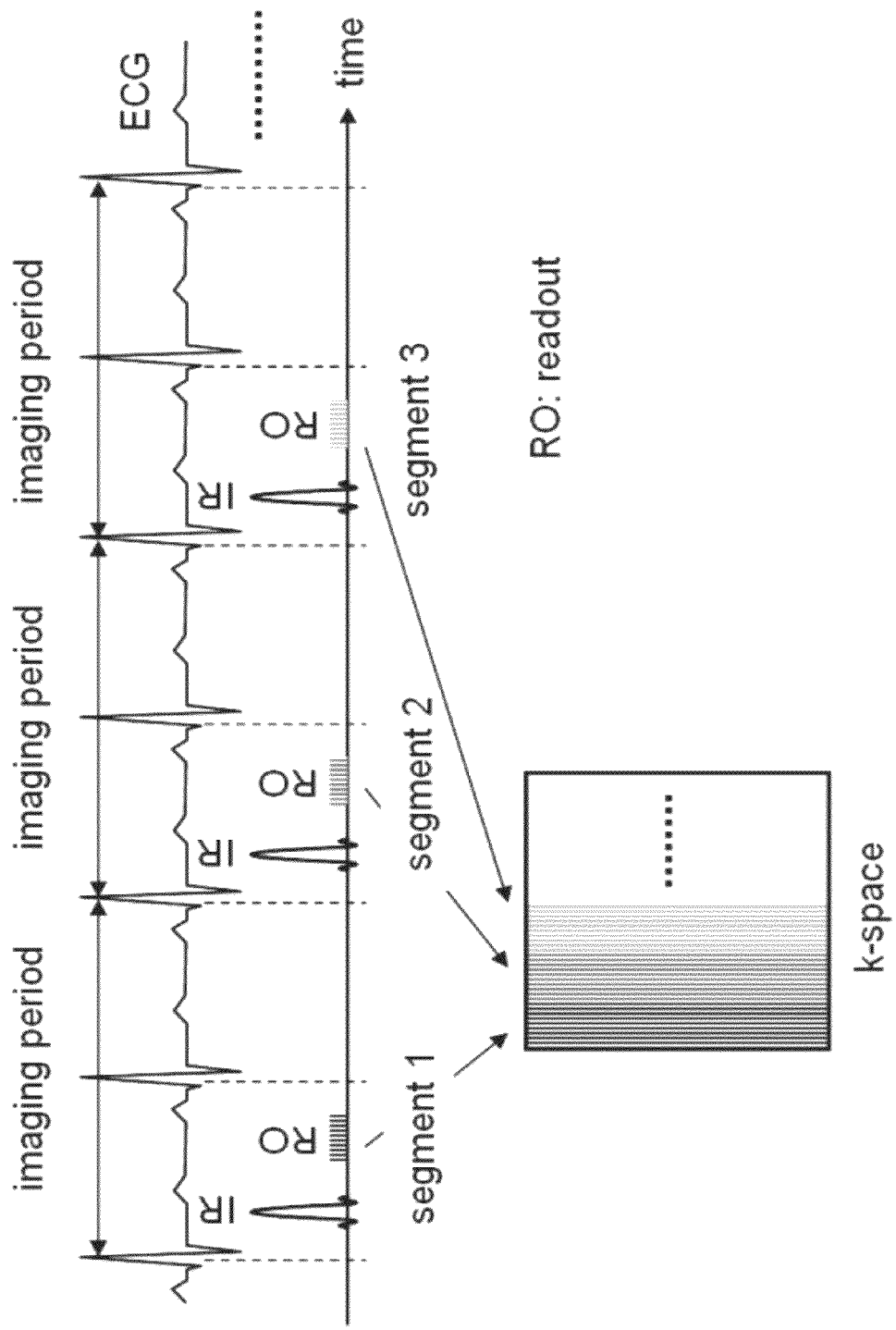
FIG. 1 shows a timing diagram of a known segmented IR sequence (gated using an ECG signal) and arrangement of acquired MR data in a raw data space.
Figure 2:
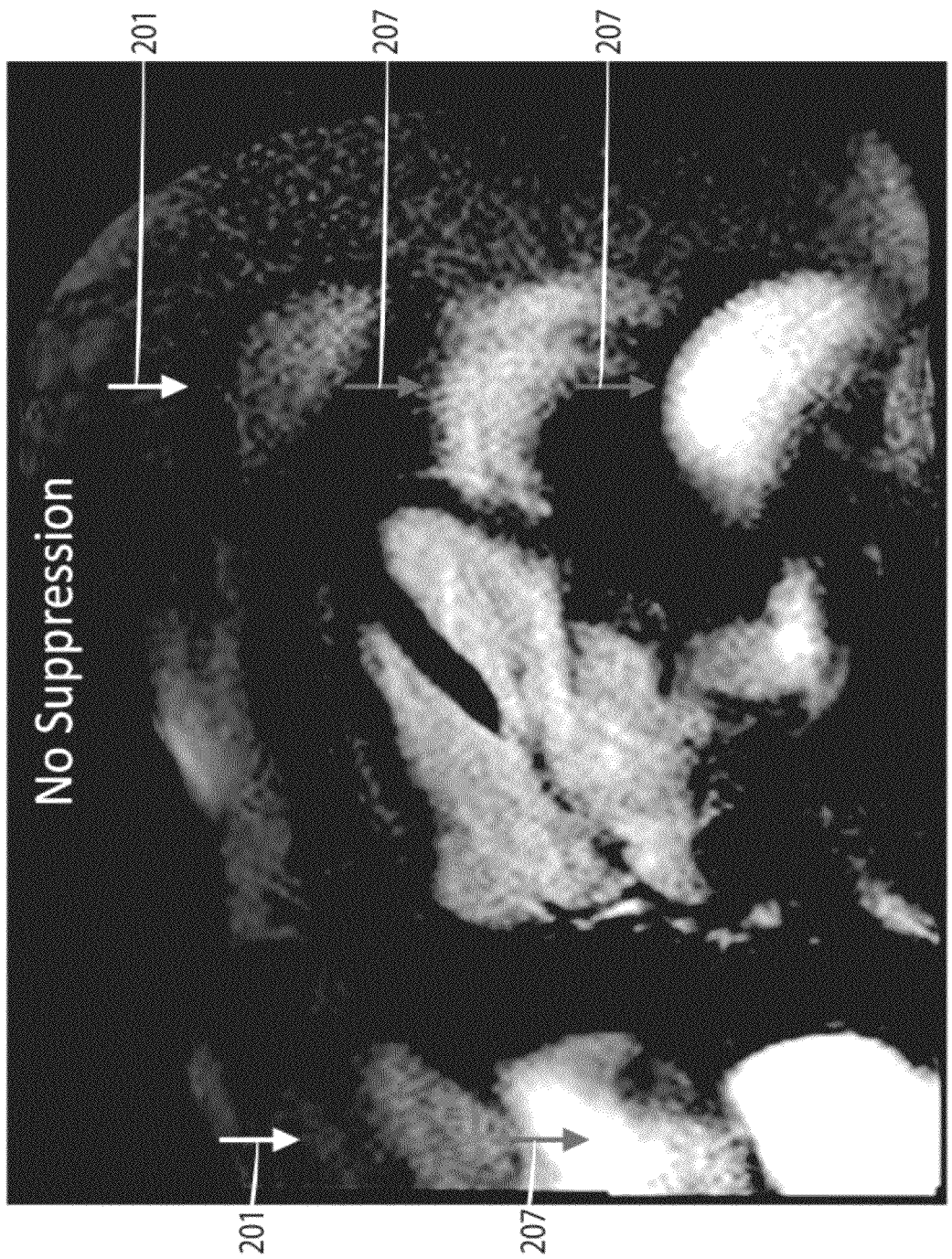
FIG. 2 shows long T1 species related ghosting artifacts in a patient.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted, T2 weighted). Adiabatic IR pulses are used to give more uniform contrast throughout an imaging volume than non-adiabatic RF pulses.

iPAT (integrated Parallel Acquisition Techniques) comprises "parallel imaging". It enables faster scanning through reduced phase encoding and addition of RF coil information. An iPAT factor of 2 enables scanning about twice as fast, iPAT factor of 3 enables scanning about three times as fast and so on.

TI=inversion time, the time between an inversion recovery pulse and the next RF excitation pulse. TI determines the image contrast.

$T_1$=the longitudinal (or spin-lattice) relaxation time $T_1$ decay constant.

$T_2$=the transverse (or spin-spin) relaxation time $T_2$ is the decay constant.

TR=repetition time, the time between successive RF excitation pulses.

FA=flip angle, i.e., an RF flip angle. For an inversion pulse, FA=180 degrees.

Spoiler gradient=a magnetic field gradient pulse applied to effectively remove transverse magnetization of a field coil by producing a rapid variation of its phase along the direction of the gradient.

Segmented data acquisition records the different parts of k-space data space (the segments) in a periodic fashion by repeatedly playing out a pulse sequence comprising an inversion pulse sequence and MR data acquisition pulses and acquiring a different set of k-space lines during readout (acquisition).

Single shot data acquisition records different parts of k-space data during a single acquisition period.

B0 is the main static base MRI magnetic field.

B1 is the RF transmit coil field.

Ghosting artifacts from fluids with long T1 values (long T1 species) frequently occur in magnetic resonance images acquired with a segmented inversion recovery (IR) pulse sequence. In repeated IR-single shot imaging, the image intensity of long-T1 species can vary between slices. These artifacts can be advantageously suppressed using a post-suppression system. Typical long T1 species are fluids with a very long longitudinal recovery time, T1, (T1≥1 second) such as pericardial effusion, pleural effusion, saline in breast implants, and cerebrospinal fluid. What constitutes a "long T1 species" depends on its T1 value relative to the imaging period. A T1 species having magnetization that does not reach steady state after one dummy imaging period may be considered a long T1 species. In clinical practice, an imaging period usually lasts between 1600 ms and 2000 ms and a T1 above 1000 ms is regarded as "long". In the system, after a readout (acquisition) of each data segment (or in the case of single shot imaging, each full acquisition of an image slice), a post-suppression module consisting of an RF pulse flanked by spoiler gradients resets the magnetization so that the magnetization is driven to steady state. Data from the first readout preceding this post-suppression module is not at steady state and is therefore excluded and data acquired in steady state is used for image reconstruction.

Known pre-suppression methods typically only work for a single long T1 species and require determination of a time delay that depends on a single, and often imprecisely known, long T1 value and on other variable parameters such as the patient heart rate. In clinical practice, these parameters are not known precisely or they vary throughout a scan thus degrading capability of known methods to suppress ghosting from a single T1 species. In contrast, the system advantageously does not need to know the value of the long T1 species to suppress the artifact that it causes, and can suppress multiple different long T1 species concurrently. This is advantageous in clinical imaging as multiple and imprecisely known long T1 species are often present in the same imaged region. This system is therefore more robust, easier to implement, and has a high suppression efficiency by concurrently suppressing artifacts from multiple long T1 species present in an image.

Figure 4:
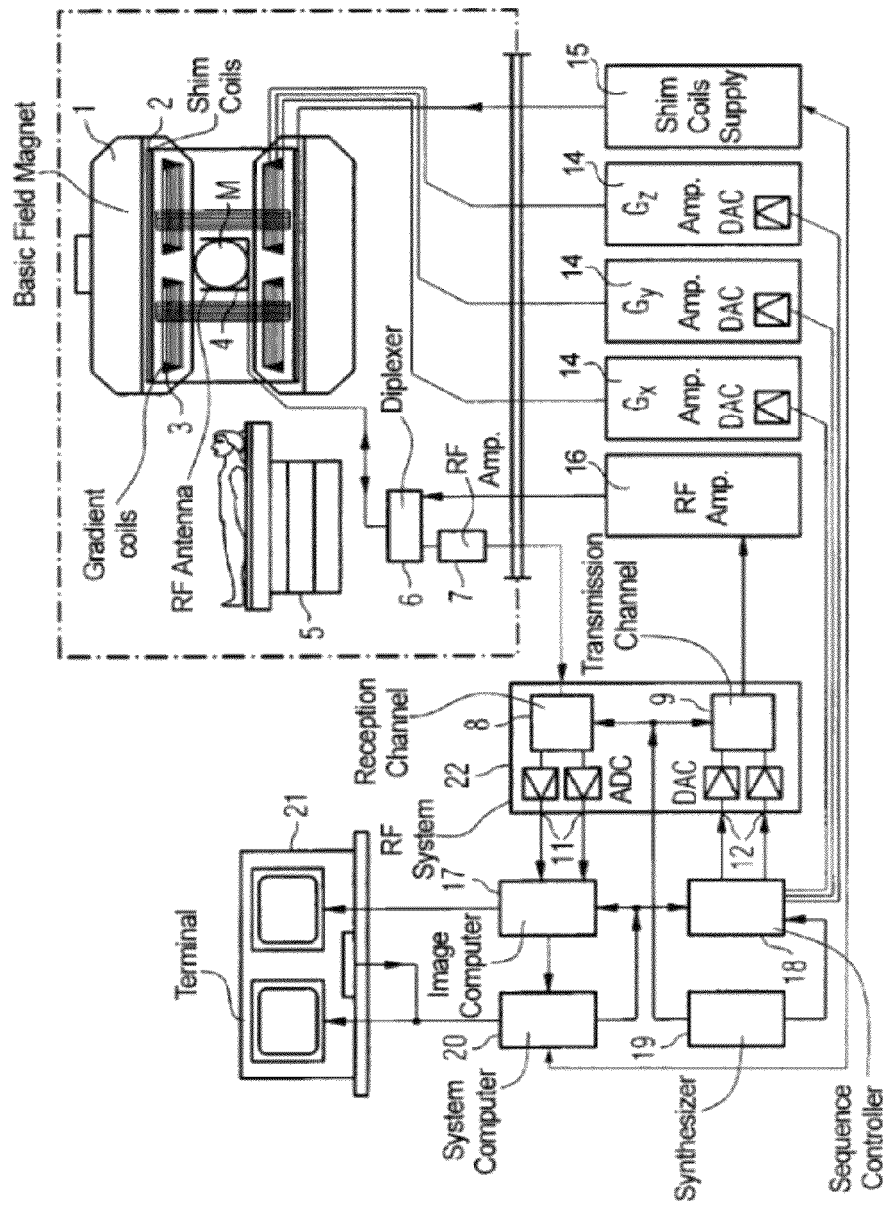
FIG. 4 shows an MR imaging system for suppressing artifacts arising from long longitudinal relaxation time (T1) of tissue, fluids, or other matter, according to invention principles.

FIG. 4 shows MR imaging system 10 for suppressing artifacts arising from long longitudinal relaxation time (T1) of tissue, fluids, or other matter. System 10 provides a post-saturation method for suppression of ghosting artifacts arising from species with long T1 values in inversion-recovery magnetic resonance images. RF coils 4 emit RF pulses to excite hydrogen nuclear spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences and corresponding acquisition of k-space data. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

MR image acquisition device of system 10 acquires, over multiple heart beats, image datasets representing one or more image slices of an anatomical region of interest of a patient. RF (Radio frequency) coils 4 provide RF signal excitation of the region of interest and acquire RF data following the signal excitation in response to a pulse sequence. The pulse sequence is used by the MR image acquisition device in acquiring RF data and comprises a standard image acquisition (and, if desired, standard preparation module) immediately followed by a saturation pulse preceded and followed by magnetic field gradient pulses for de-phasing transverse magnetization. Saturation recovery pulses are used in known systems for creating T1 image contrast, e.g. in myocardial perfusion imaging. System 10 advantageously uses a saturation pulse combined with leading and trailing spoiler pulses, played after individual segmental readouts for non-spatially selective suppression of ghosting artifacts.

System 10 (FIG. 4) advantageously provides reliable artifact suppression without user input and uses a non-spatially selective saturation pulse (and gradient pulses) so that artifacts from different image regions containing long T1 fluids are suppressed. The system drives T1 magnetization to steady state and prevents ghosting from different T1 species at the same time without lengthening breath hold time and substantially completely suppresses the artifacts. System 10 suppresses ghosting artifacts in images of different body regions (cardiac MR, head/neurological MR, orthopedic MR, for example) without reduction of MR signal and without reduction in signal to noise (SNR). The system pulse sequence is not limited to a specific type of data readout and may be combined with steady state free precession (SSFP, Siemens proprietary name TrueFisp), gradient echo (GRE, Siemens proprietary name Flash, Fast Low Angle SHot), and TSE (turbo-spin echo) readout pulse sequences. The system is also advantageously usable with different segmented or single shot inversion recovery pulse sequences, irrespective of readout used.

Figure 5:
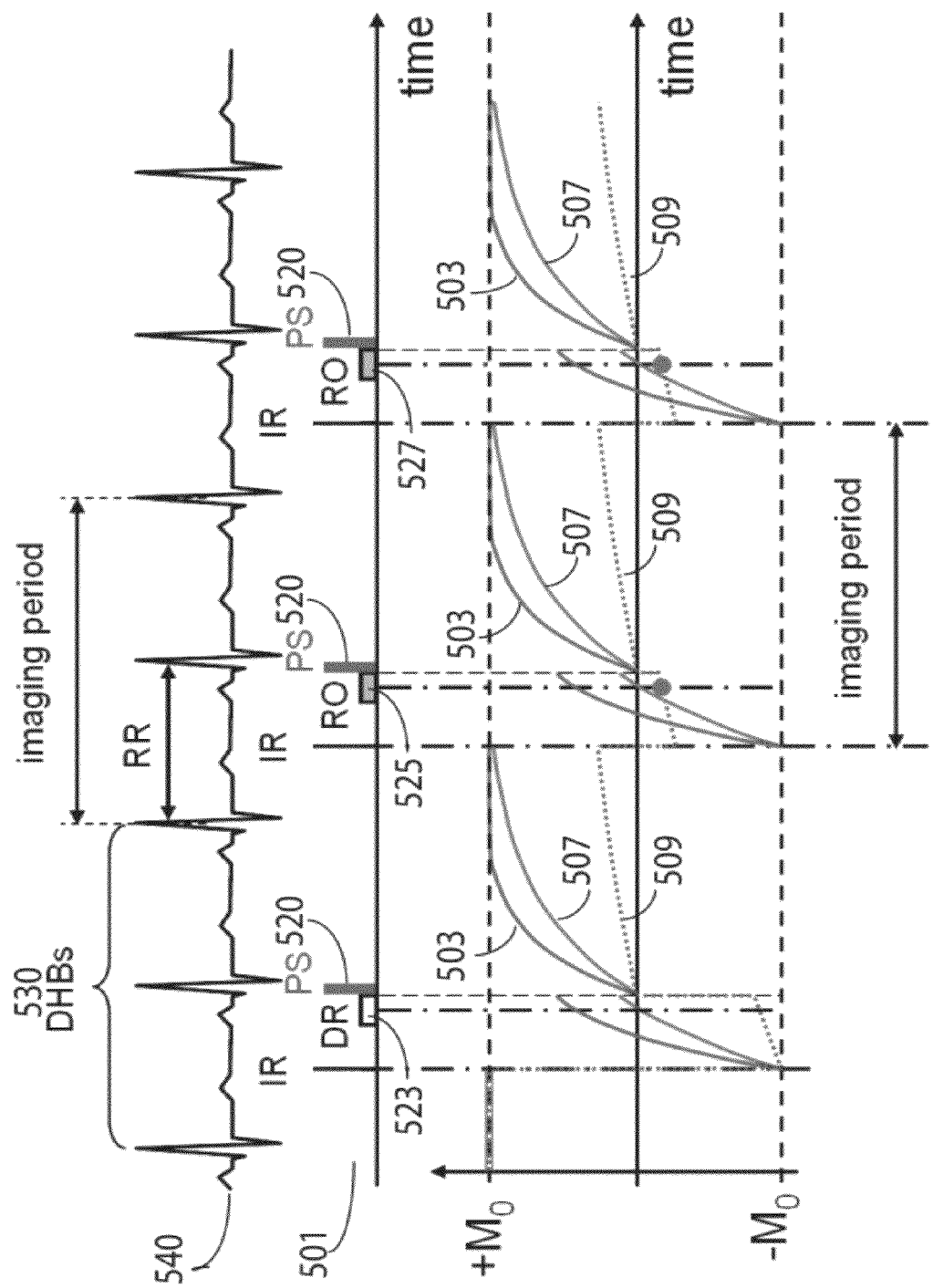
FIG. 5 shows a gated segmented IR pulse sequence and T1-relaxation curves with advantageous post suppression played after each readout to destroy both longitudinal and transverse magnetization so that long T1 species magnetization reaches steady state after the first readout (a dummy readout), according to invention principles.

FIG. 5 shows a gated segmented IR pulse sequence 501 and T1-relaxation curves 503, 507 and 509 with advantageous post-suppression played after each readout to destroy both longitudinal and transverse magnetization so that long T1 species magnetization reach steady state after the first readout 523 (a dummy readout). Gating is provided using an ECG (electrocardiogram) signal 540, for example. System 10 provides a post-suppression (PS) pulse sequence 520 that is played (substantially immediately in one embodiment) after each readout (523, 525, 527). The pulse sequence 520 destroys both longitudinal and transverse magnetization so that the magnetization reaches steady state after first readout 523. Data from first readout 523 has not reached steady state and is therefore discarded so it is termed a "dummy readout" (DR). The respective leading heartbeats 530 are called "dummy heartbeats" (DHBs). After dummy readout 523, the three species T1-relaxation curves 503, 507 and 509 repeat their respective individual recovery curves during each imaging period. Data acquired in steady state is used for image reconstruction and data acquired in non-steady state imaging periods is excluded from use in image reconstruction. Achieving steady state magnetization is a prerequisite to avoid ghosting artifacts. The long T1-relaxation curve 509 has the same amplitude and phase (phase not shown) for each data readout RO.

Figure 7:
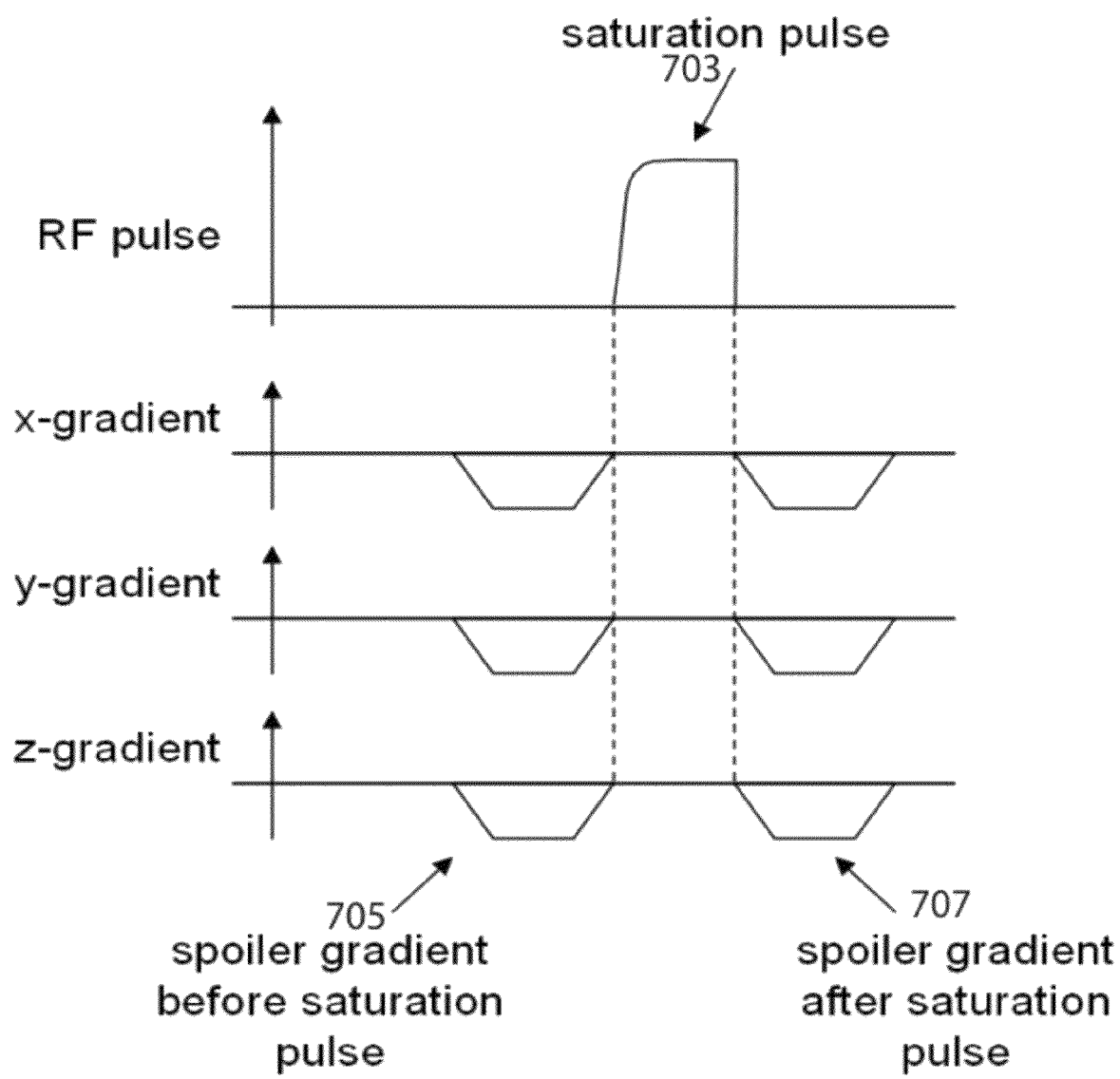
FIG. 7 shows a post-suppression pulse sequence including a saturation recovery (SR) pulse substantially immediately preceded and followed by magnetic field spoiler gradient pulses, according to invention principles.
Figure 8:
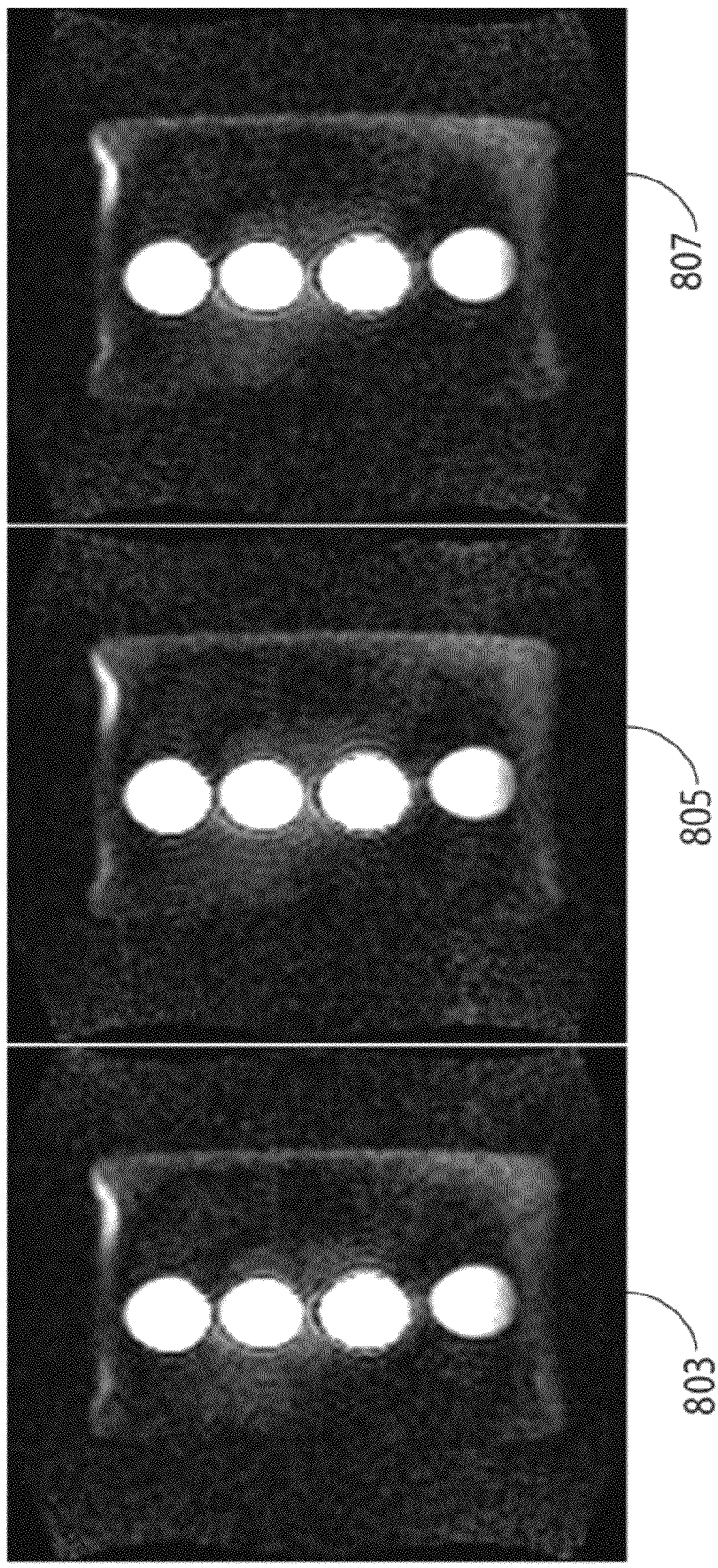
FIG. 8 shows three images acquired with the three different SR pulses, according to invention principles.

FIG. 7 shows a post-suppression pulse sequence including a saturation recovery (SR) pulse 703 substantially immediately preceded and followed by magnetic field spoiler gradient pulses 705 and 707 in the x, y and z coordinate directions. System 10 (FIG. 4) suppresses artifacts arising from fluids, tissue, or other matter with long T1 values when acquiring magnetic resonance data with a pulse sequence that assumes incorrectly that magnetization is at steady state. The saturation recovery (SR) radio frequency (RF) pulse 703 is an adiabatic pulse but may be of different type, for example a rectangular, an adiabatic, or a composite pulse. FIG. 8 shows three images acquired with the three different SR pulses. Specifically, image 803 shows an image acquired with a rectangular SR pulse, image 805 shows an image acquired with an adiabatic SR pulse and image 807 shows an image acquired with a composite SR pulse. Spoiler gradient pulses 705 and 707 (FIG. 7) may be played on the same gradient axis after each of the readouts, or they may be varied to play on a different axis each time, in a periodic, random or pseudo-random rotation scheme. The pulse sequence comprising pulses 703, 705 and 707 is played out after each data segment readout and the sequence includes leading dummy heartbeats 530 (FIG. 5).

Figure 3:
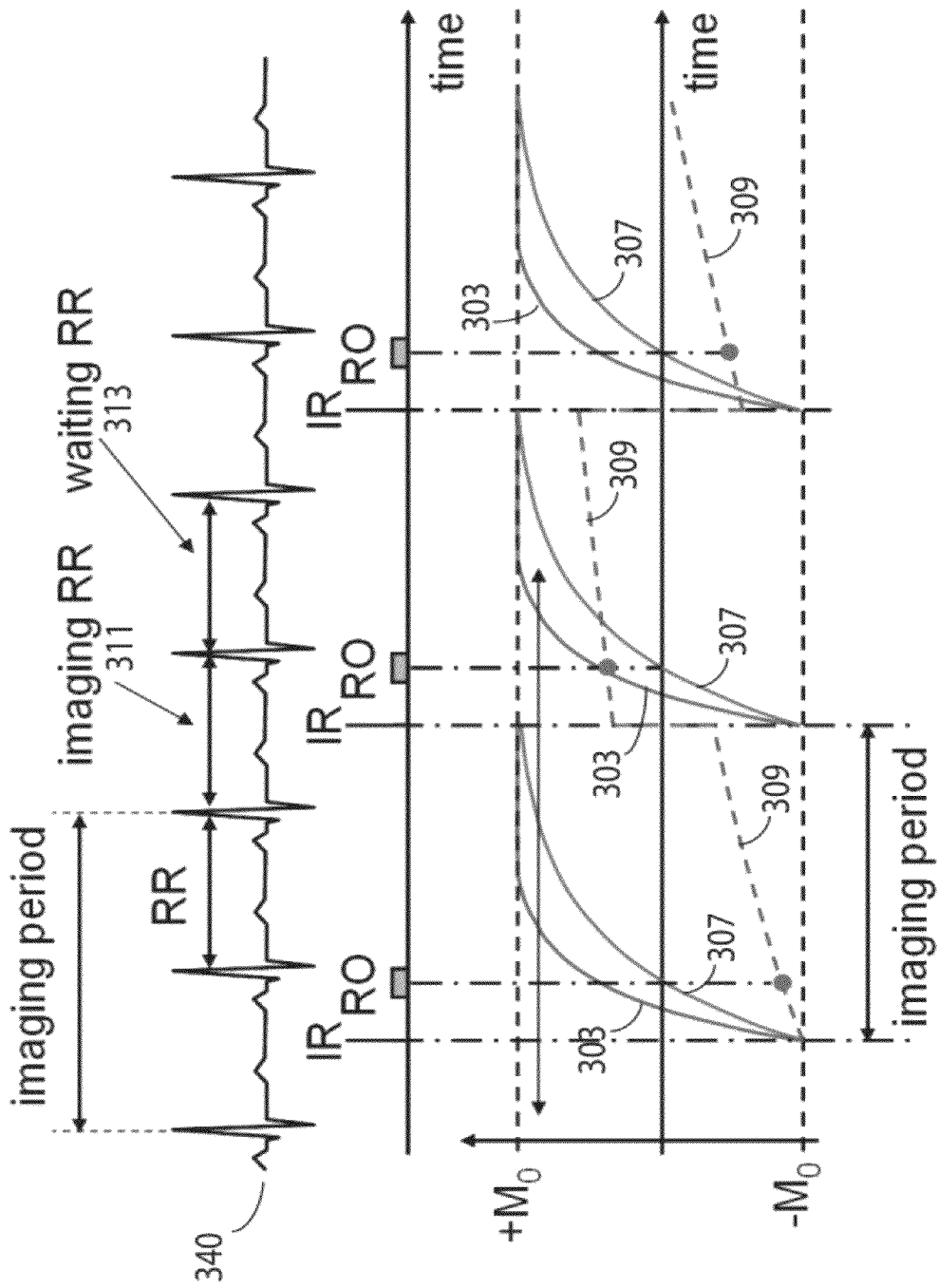
FIG. 3 shows magnetization of a short, medium, and long T1 species.

A comparison of the temporal variation of the long T1 species magnetization in FIG. 3 (curve 307) and FIG. 5 (curve 507) shows the difference between long T1 species magnetization in known systems and in a system according to invention principles. Specifically, curve 307 of FIG. 3 produced without use of an artifact post-suppression module (and in the presence of leading dummy periods, not shown) indicates long T1 species magnetization oscillates widely from one acquisition to the next. Curve 507 of FIG. 5 is provided advantageously using the post-suppression pulse sequence of FIG. 7 and shows magnetization of the long T1 species is substantially the same during data acquisition (readout) of different imaging periods and without oscillation. Long T1 magnetization curve 507 is substantially the same in different imaging periods and is therefore in steady state, and ghosting is prevented.

Figure 6:
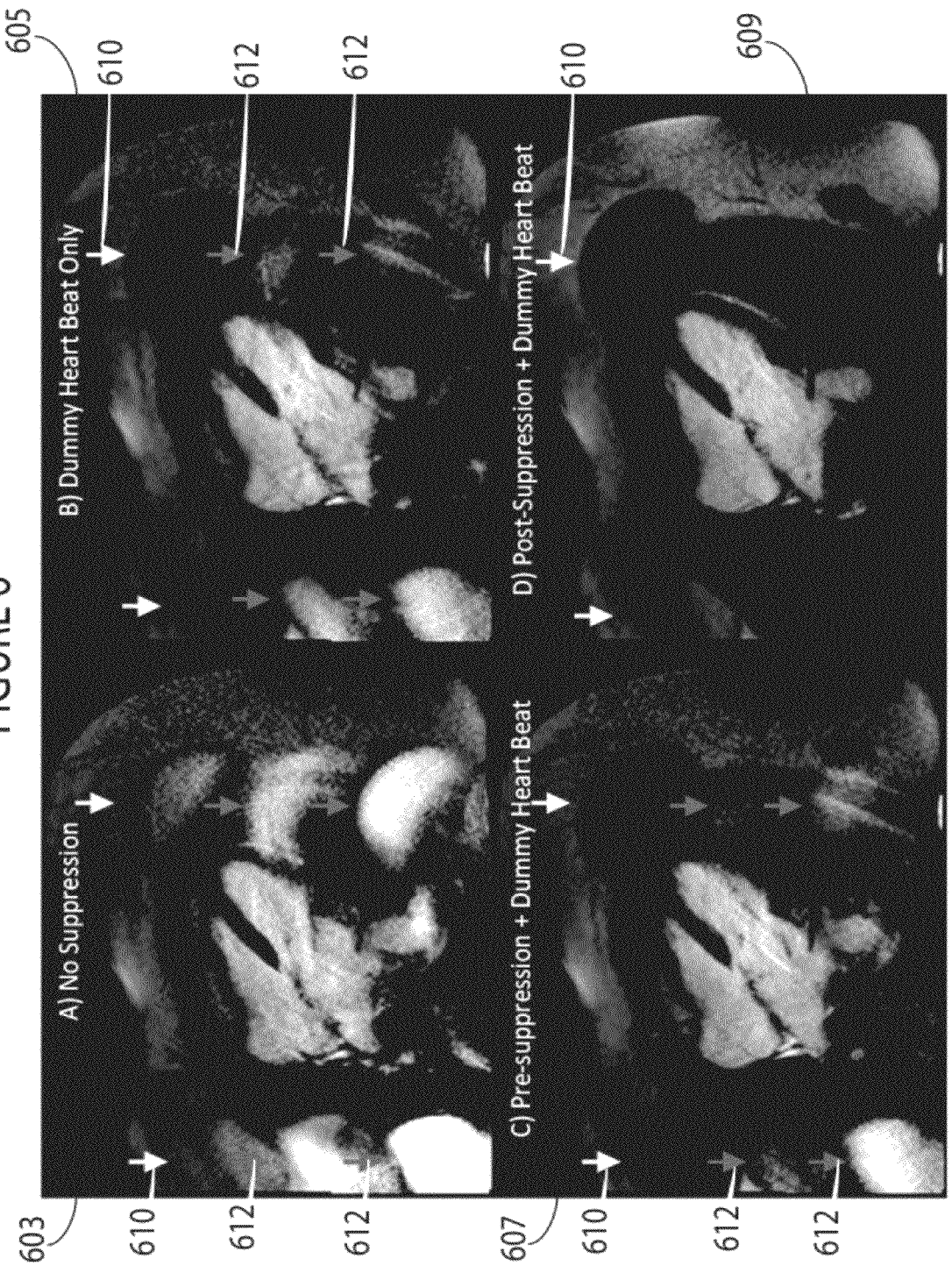
FIG. 6 shows a four-chamber view of the human heart in a patient with breast implants acquired by a gated segmented inversion recovery (IR) gradient echo sequence and using different artifact suppression methods, according to invention principles.

FIG. 6 shows images 603, 605, 607 and 609 individually presenting a four-chamber view of the human heart in a patient with breast implants acquired by a gated segmented inversion recovery (IR) gradient echo sequence and using different artifact suppression methods. White arrows, e.g., 610, indicate a long T1 species feature and gray arrows, e.g., 612, show ghosting of the feature in images 603, 605 and 607. Image 603 shows images acquired without any artifact suppression and shows severe ghosting indicated by gray arrows. Image 605 is acquired using a pulse sequence employing dummy heartbeats but still showing substantial ghosting artifacts. Image 607 is acquired using a known pre-suppression method described in Patent application US20100219829 "Long T1 Artifact Suppression Techniques for Magnetic Resonance" (Sep. 2, 2010) by Wolfgang G Rehwald, Enn-Ling Chen, Raymond J. Kim which reduces ghosting artifacts more than dummy heartbeats alone, but does not fully suppress the artifacts. Image 609 shows an image acquired by system 10 (FIG. 4) using the post-suppression and dummy heartbeat pulse sequence of FIG. 5 to substantially completely suppress the ghosting artifacts. Another known method for artifact suppression is described in "Ghost Artifact Cancellation Using Phased Array Processing" (Aug. 3, 2004) by Peter Kellman and Elliot McVeigh, which reduces artifacts using phase sensitive reconstruction. The images 603-609 are all reconstructed using phased array coils, which do not substantially reduce the appearance of long T1 ghosts.

Long-T1 species matter occurs throughout the human body (CSF for example is abundant around the brain and spine) and the system is applicable to MRI of different body regions. The system may be used as an artifact suppression module for a segmented acquisition, or stack of single shot images, where data acquisition occurs repeatedly at periodic time points irrespective of the acquisition's periodicity. It can be used at a fixed time period between adjacent acquisitions or by gating using an ECG signal (curve 340 of FIG. 3 and curve 540 of FIG. 5, or by a finger pulse (pulse oximetry) or by position of the diaphragm (navigator gating), or other methods). For system 10 to suppress artifacts, it does not matter whether the acquisition period varies during the acquisition, such as in the case of arrhythmias resulting in irregular RR intervals. The system is sufficiently robust to cope with these variations.

Figure 9:
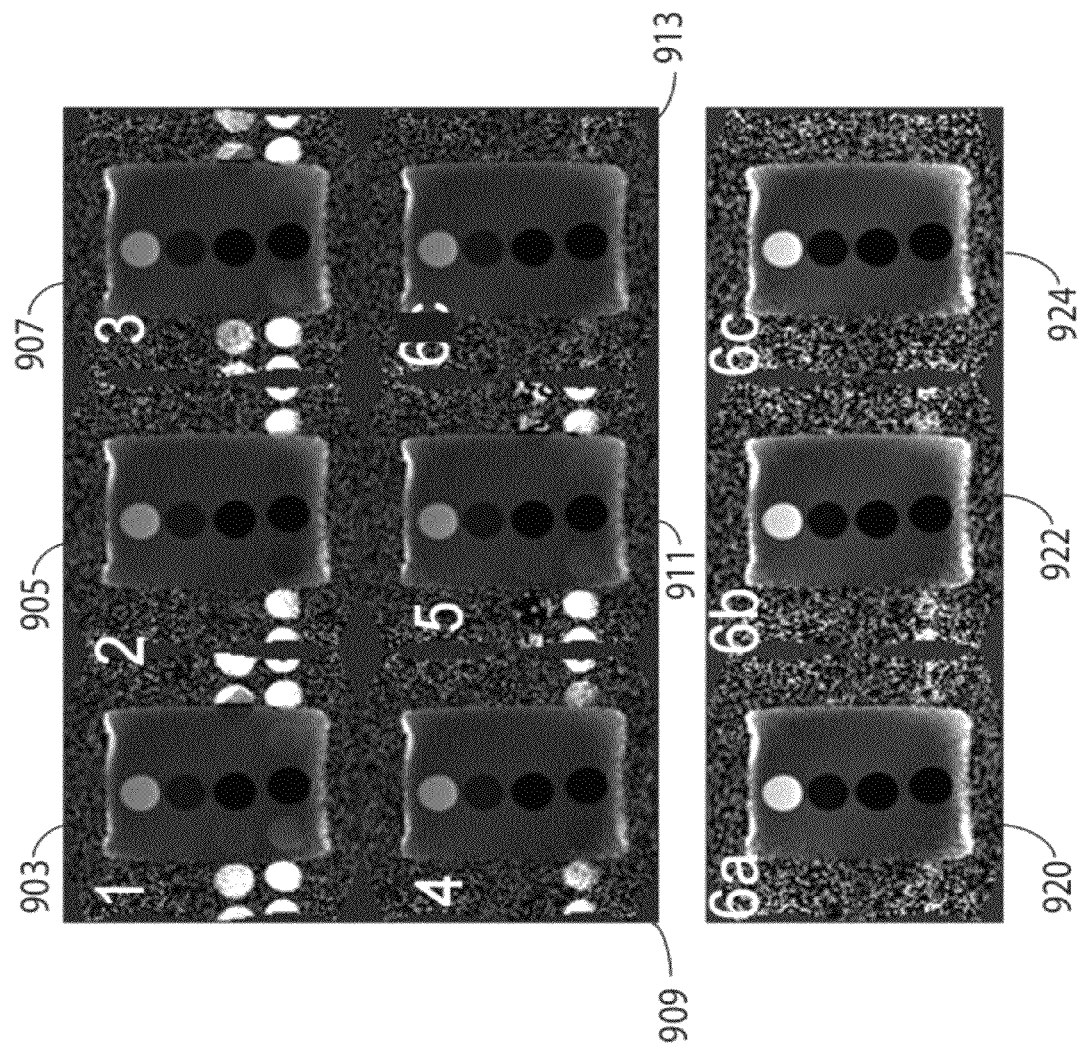
FIG. 9 shows phase sensitive inversion recovery (PSIR) images with distinct ghosting artifacts and images acquired with ghosting artifacts suppressed by a system according to invention principles.

Phase sensitive inversion recovery (PSIR) methods are fundamentally different to the inventive system and benefit from the inventive system. FIG. 9 shows phase sensitive inversion recovery (PSIR) images with distinct ghosting artifacts and images acquired with ghosting artifacts suppressed by the system. Image 903 is acquired without any artifact suppression, image 905 is acquired with the use of known dummy heartbeats and image 907 is acquired using known pre-suppression method without dummy heartbeats. Image 909 is acquired with a known pre-suppression method using dummy heart beats. Image 911 is acquired with post-suppression but without dummy heart beats and image 913 is acquired by system 10 (FIG. 4) using the FIG. 5 (and FIG. 7) illustrated post-suppression module and dummy heart beats. Images 6a, 6b, and 6c are acquired using a rectangular SR pulse, an adiabatic SR and a composite SR pulse, respectively. Ghosting artifacts are present in images 903-911 but are suppressed in images 913, 920, 922 and 924.

The system has been implemented on a Siemens MAGNETOM Verio (3 Tesla) MR System and an Avanto (1.5 Tesla) clinical MR scanner, and is readily implemented on other different MRI scanners without need for additional hardware. The system may be implemented by integrating it into portions of existing software so that it can be played with different segmented inversion recovery sequences. The system may comprise code that controls iterative scanning (e.g. iterative scanning over multiple heart beats and segments) and the code may be used by different types of pulse sequences. The system is of particular value in higher field strength MRI scanners (i.e. 3 T instead of 1.5 T) as T1 increases with field strength increasing the occurrence of the long T1 species related ghosting. The system 10 artifact suppression module may be played out after the segmented readout of many types of MRI and NMR (nuclear magnetic resonance) pulse sequences. The module suppresses artifacts in various regions of the human body and in different pulse sequences that acquire data in a segmented and periodic (such as gated) fashion. The system clarifies an MR image even in cases where no distinct ghosting artifacts are visible or where poor image quality had been attributed to factors other than long T1 species.

Figure 10:
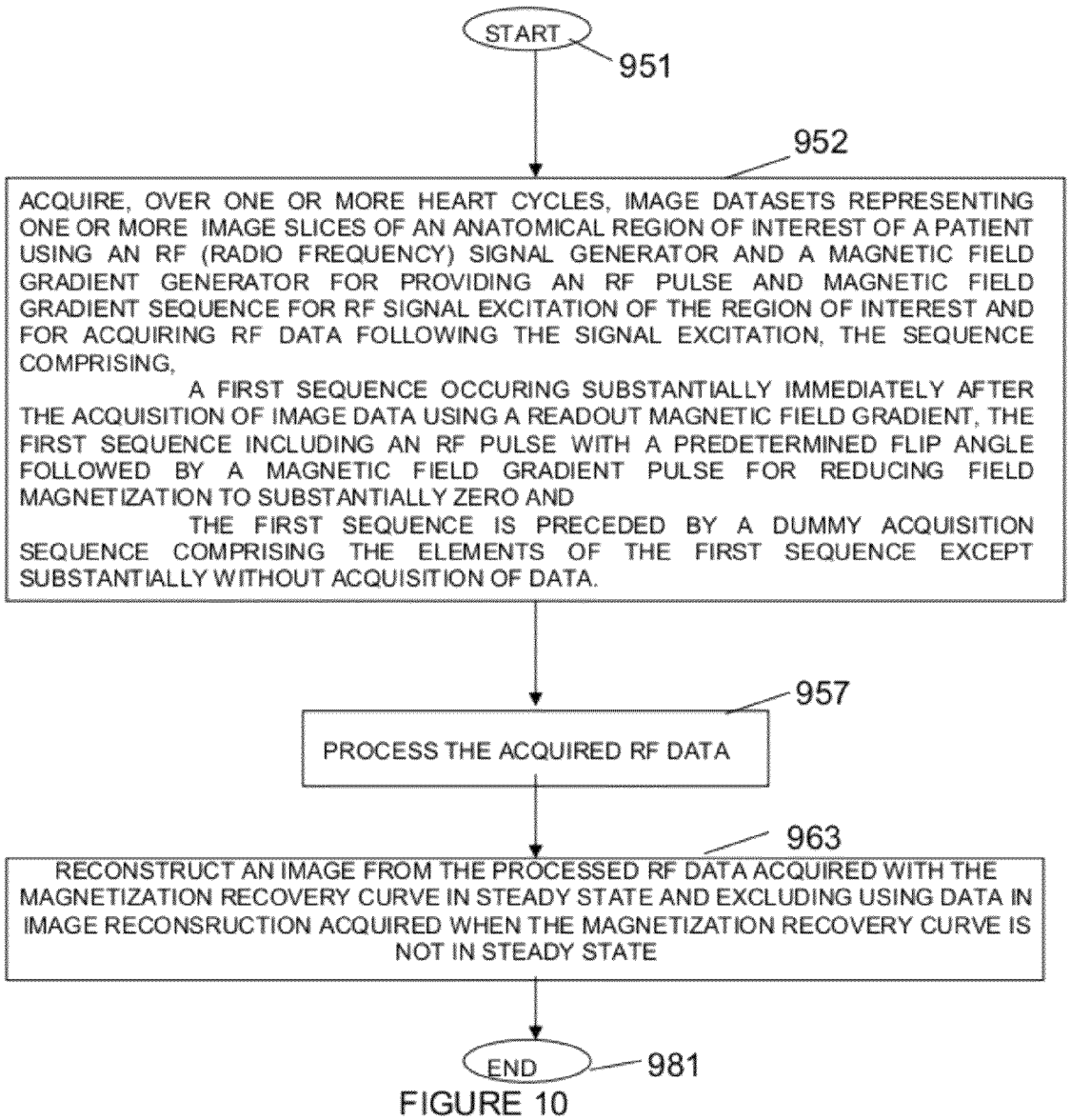
FIG. 10 shows a flowchart of a process performed by an MR imaging system for suppressing artifacts arising from long longitudinal relaxation time (T1) of tissue, fluids, or other matter, according to invention principles.

System 10 (FIG. 4) suppresses artifacts arising from tissue, fluids, or other matter with long T1 values when acquiring magnetic resonance data with a pulse sequence that assumes incorrectly that magnetization is at steady state. The artifact suppression is achieved by a selective, non-selective, or volume-selective suppression pulse and gradients together termed an artifact post-suppression module (PSM) that is played substantially immediately after each readout event of a segmented periodic pulse sequence. In one embodiment, the pulse sequence is a segmented inversion recovery sequence in which the pulse sequence acquires a series of single-shot images or in which the pulse sequence acquires a data and a reference data set such as, but not limited to, phase sensitive inversion recovery (PSIR). The pulse sequence uses a gradient echo (GRE) readout or a gradient or RF-spoiled gradient echo readout. In one embodiment, the pulse sequence uses a steady state free precession (SSFP) readout or a Turbo-spin echo (TSE) readout. The system uses a Cartesian, radial, elliptical or echo planar 2D readout or a 3D readout FIG. 10 shows a flowchart of a process performed by an MR imaging system for suppressing artifacts arising from long longitudinal relaxation time (T1) of tissue, fluids, or other matter. In step 952 following the start at step 951, MR image acquisition device 10 (FIG. 4) acquires, over one or more heart cycles, image datasets representing one or more image slices of an anatomical region of interest of a patient. MR image acquisition device 10 acquires the image slices in response to a heart cycle synchronization signal. The device includes an RF (Radio Frequency) signal generator and a magnetic field gradient generator. The RF (Radio Frequency) signal generator (RF coils 4) generates RF excitation pulses in an anatomical region of interest and enables subsequent acquisition of associated RF echo data. The magnetic field gradient generator (gradient system 3) generates magnetic field gradients for phase encoding and readout RF data acquisition. The RF (Radio Frequency) signal generator and magnetic field gradient generator provide an RF pulse and magnetic field gradient sequence for RF signal excitation of the region of interest and for acquiring RF data following the signal excitation. The sequence comprises, a first sequence occurring substantially immediately after the acquisition of image data using a readout magnetic field gradient. The first sequence includes an RF pulse with a predetermined flip angle followed by a magnetic field gradient pulse for reducing field magnetization to substantially zero. The first sequence is preceded by a dummy acquisition sequence comprising the elements of the first sequence including a dummy readout readout magnetic field gradient, except substantially without acquisition of data and for which MR signal data is not acquired. The sequence may be used in acquisition of image datasets representing a series of segmented images.

The elements of the first sequence comprise a readout magnetic field gradient followed by an RF pulse with the predetermined flip angle followed by a magnetic field gradient pulse for reducing field magnetization to substantially zero. The predetermined flip angle comprises substantially 90° and comprises a saturation pulse and the magnetic field gradient pulse for reducing field magnetization to substantially zero comprises a gradient spoiler pulse. In one embodiment, the first sequence comprises a saturation recovery pulse substantially immediately preceded and followed by magnetic field gradient pulses for substantially reducing transverse magnetization of the anatomical region substantially immediately following RF data acquisition. The first sequence is used to de-phase transverse magnetization following RF data acquisition substantially immediately after each RF data acquisition event of a segmented periodic pulse sequence and substantially immediately after each RF data acquisition event of a single shot periodic pulse sequence. The first sequence comprises a sequence providing magnetization preparation prior to readout including at least one of,
(a) T1 weighting, (b) T2 weighting and (c) magnetization transfer preparation. Also the first sequence is used in acquisition of image datasets representing a series of single-shot images and is used in acquisition of a data and a reference image dataset in a phase sensitive inversion recovery (PSIR) pulse sequence.

The RF pulse, which comprises a rectangular, an adiabatic or a composite pulse, for example, is preceded by a magnetic field gradient pulse for reducing field magnetization to substantially zero. In one embodiment, magnetic field gradient pulses precede and follow the RF pulse and in combination reduce the field magnetization to substantially zero. In an embodiment, the RF pulse is substantially immediately preceded and followed by magnetic field gradient pulses for substantially reducing transverse magnetization of the anatomical region and the magnetic field gradient pulses are used on the same gradient axis coil after successive RF data acquisition events. Further in one embodiment, the RF pulse is substantially immediately preceded and followed by magnetic field gradient pulses for substantially reducing transverse magnetization of the anatomical region and are used on different gradient axes after successive RF data acquisition events at least one of, periodically, randomly and pseudo-randomly in a rotation between different gradient axes.

In step 957, imaging computer 17 processes the acquired RF data and in step 963 reconstructs an image from the processed RF data acquired with the magnetization in steady state and excludes using data in image reconstruction acquired when the magnetization is not in steady state. The acquisition of image data uses at least one of, (a) a gradient echo (GRE) readout acquisition, (b) an RF-spoiled gradient echo readout, (c) a steady state free precession (SSFP) readout acquisition, (d) a Turbo-spin echo (TSE) readout acquisition, (e) a Cartesian, radial, elliptical or echo planar 2D readout acquisition and (f) a 3D readout acquisition. The process of FIG. 10 terminates at step 981.

Continuing with operation of system 10 (FIG. 4), basic field magnet 1 generates a strong magnetic field, which is constant in time, for the polarization or alignment of the nuclear spins in the examination region of an object, such as, for example, a part of a human body to be examined. The high homogeneity of the basic magnetic field required for the magnetic resonance measurement is provided in a spherical measurement volume M, for example, into which the parts of the human body to be examined are brought. In order to satisfy the homogeneity requirements and especially for the elimination of time-invariant influences, shim-plates made of ferromagnetic material are mounted at suitable positions. Time-variable influences are eliminated by shim coils 2, which are controlled by a shim-current supply 15.

In the basic magnetic field 1, a cylinder-shaped gradient coil system 3 is used, which consists of three windings, for example. Each winding is supplied with current by an amplifier 14 in order to generate a linear gradient field in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence controller 18 for the generation of gradient pulses at proper times.

Within the gradient field system 3, radio-frequency (RF) coils 4 are located which converts the radio-frequency pulses emitted by a radio-frequency power amplifier 16 via multiplexer 6 into a magnetic alternating field in order to excite the nuclei and align the nuclear spins of the object to be examined or the region of the object to be examined. In one embodiment, RF coils 4 comprise a subset or substantially all of, multiple RF coils arranged in sections along the length of volume M corresponding to the length of a patient. Further, an individual section RF coil of coils 4 comprises multiple RF coils providing RF image data that is used in parallel to generate a single MR image. RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the precessing nuclear spins, are converted into a voltage that is supplied via an amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M. The conversion from transmitting to receiving operation is done via a multiplexer 6. System computer 20 automatically (or in response to user command entered via terminal 21) determines pulse sequences for suppressing artifacts arising from long longitudinal relaxation time (T1) of tissue, fluids, or other matter in MR imaging.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication therebetween. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A user interface (UI), as used herein, comprises one or more display images, generated by a user interface processor and enabling user interaction with a processor or other device and associated data acquisition and processing functions.

The UI also includes an executable procedure or executable application. The executable procedure or executable application conditions the user interface processor to generate signals representing the UI display images. These signals are supplied to a display device which displays the image for viewing by the user. The executable procedure or executable application further receives signals from user input devices, such as a keyboard, mouth, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of FIGS. 4-9 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. A system suppresses long T1 species ghosting artifacts using a pulse sequence initiated after a readout (acquisition) of individual data segments that resets magnetization so that a magnetization is at steady state after the pulse sequence. Further, the processes and applications may, in alternative embodiments, be located on one or more (e.g., distributed) processing devices on a network linking the units of FIG. 4. Any of the functions and steps provided in FIGS. 4-9 may be implemented in hardware, software or a combination of both.

What is claimed is:

1. A system for suppressing artifacts arising from long longitudinal relaxation time (T1) of tissue, fluids, or other matter in MR imaging, comprising:

an MR image acquisition device for acquiring, over a plurality of consecutive data acquisition periods, image datasets representing one or more image slices of an anatomical region of interest of a patient, comprising:

an RF (Radio Frequency) signal generator and a magnetic field gradient generator for providing an image data acquisition sequence, said image data acquisition sequence comprising:

for each period of the plurality of consecutive data acquisition periods:

an RF excitation signal for excitation of said anatomical region of interest;

a data readout following said RF excitation signal for image data acquisition; and a first sequence occurring substantially immediately after the data readout, said first sequence including an RF pulse with a predetermined flip angle followed substantially immediately by a magnetic field gradient pulse for reducing field magnetization of said anatomical region of interest to substantially zero, and a dummy acquisition sequence preceding a first one of the plurality of consecutive data acquisition periods, comprising said RF excitation signal and said first sequence, without acquisition of image data.

2. A system according to claim 1, wherein
said predetermined flip angle comprises is substantially 90° and said RF pulse comprises a saturation pulse.

3. A system according to claim 1, wherein
said first sequence further comprises a further magnetic field gradient pulse preceding said RF pulse for reducing field magnetization to substantially zero.

4. A system according to claim 1, wherein
the data readout comprises a readout magnetic field gradient.

5. A system according to claim 1, wherein
said RF pulse comprises a saturation recovery pulse that is substantially immediately followed by said magnetic field gradient pulse for substantially reducing both longitudinal and transverse magnetization of said anatomical region.

6. A system according to claim 1, wherein
said RF excitation signal facilitates subsequent acquisition of associated RF echo data, and
said magnetic field gradient generator generates magnetic field gradients for phase encoding and said data readout.

7. A system according to claim 1, wherein
said first sequence is used to substantially reduce transverse magnetization of said anatomical region substantially immediately following said data readout.

8. A system according to claim 1, wherein
said first sequence is used to de-phase transverse magnetization substantially immediately after said data readout.

9. A system according to claim 1, wherein
said first sequence is used to de-phase transverse magnetization substantially immediately after said data readout, and said data readout is associated with a single shot periodic pulse sequence.

10. A system according to claim 1, wherein
said RF pulse comprises at least one of: (a) a rectangular pulse, (b) an adiabatic pulse, and (c) a composite pulse.

11. A system according to claim 1, wherein
said first sequence comprises a sequence providing magnetization preparation prior to readout including at least one of: (a) T1 weighting, (b) T2 weighting, and (c) magnetization transfer preparation.

12. A system according to claim 3, wherein
each of said magnetic field gradient pulse and said further magnetic field gradient pulse is provided on the same gradient axis coil in successive periods of said plurality of consecutive data acquisition periods.

13. A system according to claim 3, wherein
each of said magnetic field gradient pulse and said further magnetic field gradient pulse is provided on different gradient axes in successive periods of said plurality of consecutive data acquisition periods at least one of periodically, randomly, and pseudo-randomly in a rotation between different gradient axes.

14. A system according to claim 1, wherein
said image datasets are associated with a series of single-shot images.

15. A system according to claim 1, wherein
said image datasets comprise a data and a reference image dataset in a phase sensitive inversion recovery (PSIR) pulse sequence.

16. A system according to claim 1, wherein
said dummy acquisition sequence includes a readout magnetic field gradient for which image data is not acquired.

17. A system according to claim 1, wherein
said data readout comprises a gradient echo (GRE) readout magnetic field gradient.

18. A system according to claim 1, wherein
said data readout comprises at least one of: (a) a gradient echo (GRE) readout acquisition, and (b) an RF-spoiled gradient echo readout acquisition.

19. A system according to claim 1, wherein
said data readout comprises a steady state free precession (SSFP) readout acquisition.

20. A system according to claim 1, wherein
said data readout comprises a Turbo-spin echo (TSE) readout acquisition.

21. A system according to claim 1, wherein
said data readout comprises at least one of a Cartesian readout acquisition, a radial readout acquisition, an elliptical readout acquisition, and an echo planar 2D readout acquisition.

22. A system according to claim 1, wherein
said data readout comprises a 3D readout acquisition.

23. A system according to claim 1, wherein
said plurality of consecutive data acquisition periods are based on a plurality of heart cycle synchronization signals.

24. A system according to claim 1, wherein
said image datasets are associated with a series of segmented images.

25. A system according to claim 1, wherein
said RF pulse of said first sequence returns the magnetization to steady state, and
said MR image acquisition device is configured to process the image datasets and to reconstruct an image based on said image datasets.

26. A system according to claim 25, wherein
said MR image acquisition device is further configured to reconstruct an image from certain ones of the acquired image datasets that are acquired with said field magnetization in steady state and to exclude further ones of said image datasets during in image reconstruction that were acquired when the field magnetization is not in steady state.

27. A system for suppressing artifacts arising from long longitudinal relaxation time (T1) of tissue, fluids, or other matter in MR imaging, comprising:

an MR image acquisition device for acquiring, over a plurality of consecutive data acquisition periods, image datasets representing one or more image slices of an anatomical region of interest of a patient, the MR image acquisition device comprising:

an RF (Radio Frequency) signal generator and a magnetic field gradient generator configured to provide, for each of said data acquisition periods, an RF pulse and magnetic field gradient sequence, said RF pulse and magnetic field gradient sequence comprising:

a data readout to provide acquisition of said image datasets; and a first sequence provided substantially immediately after said data readout, said first sequence comprising an RF saturation pulse substantially immediately followed by a magnetic field gradient pulse for dephasing of both longitudinal magnetization and transverse magnetization of said anatomical region.

28. A system according to claim 27, wherein
said RF pulse and magnetic field gradient sequence is configured to substantially reduce transverse magnetization of said anatomical region substantially immediately following data acquisition each of said data readouts.

29. A system according to claim 27, wherein
said RF pulse and magnetic field gradient sequence is configured to destroy both longitudinal and transverse magnetization within said anatomical region of interest following data acquisition each of said data readouts.

30. A method for suppressing artifacts arising from long longitudinal relaxation time (T1) of tissue, fluids, or other matter in MR imaging, comprising the activities of:

for each of a plurality of consecutive data acquisition periods:

exciting an anatomical region of interest of a patient using at least one RF excitation signal to generate a transverse magnetization therein;

obtaining an image dataset associated with at least one image slice of said anatomical region of interest using a data readout; and providing a first pulse sequence to at least said anatomical region of interest substantially immediately after said data readout, wherein said first pulse sequence comprises an RF saturation pulse substantially immediately followed by a magnetic field gradient pulse for de-phasing of both longitudinal magnetization and transverse magnetization of said anatomical region of interest; and processing the RF image datasets to reconstruct an image of said anatomical region of interest.

31. A method according to claim 30, wherein
said processing step comprises reconstructing said image based on certain ones of said RF image datasets acquired with said longitudinal magnetization in steady state and excluding further ones of said RF image datasets acquired when the longitudinal magnetization is not in steady state.

\* \* \* \* \*